United States Patent [19]
Frederickson

[11] Patent Number: 6,105,159
[45] Date of Patent: Aug. 15, 2000

[54] TRELLIS CODE WITH IMPROVED ERROR PROPAGATION

[75] Inventor: Lisa Frederickson, Ojai, Calif.

[73] Assignee: Seagate Technology, Inc., Scotts Valley, Calif.

[21] Appl. No.: 08/973,444

[22] PCT Filed: Jun. 7, 1996

[86] PCT No.: PCT/US96/09506

§ 371 Date: Dec. 5, 1997

§ 102(e) Date: Dec. 5, 1997

[87] PCT Pub. No.: WO96/41341

PCT Pub. Date: Dec. 19, 1996

Related U.S. Application Data

[63] Continuation-in-part of application No. 08/483,117, Jun. 7, 1995, Pat. No. 5,691,993.

[51] Int. Cl.[7] .......................... H03M 13/05; H03M 13/27; G11V 20/18

[52] U.S. Cl. ........................... 714/762; 714/769; 714/792

[58] Field of Search ................................... 714/757, 758, 714/761, 762, 769, 792

[56] References Cited

U.S. PATENT DOCUMENTS

| | | | |
|---|---|---|---|
| 4,751,590 | 6/1988 | Wilkinson | 360/19.1 |
| 5,050,171 | 9/1991 | Ishijima | 371/47.1 |
| 5,109,385 | 4/1992 | Karp et al. | 371/42 |
| 5,220,568 | 6/1993 | Howe et al. | 371/37.1 |
| 5,263,030 | 11/1993 | Rotker et al. | 371/39.1 |
| 5,329,535 | 7/1994 | Coker | 371/39.1 |
| 5,373,513 | 12/1994 | Howe et al. | 371/42 |
| 5,422,760 | 6/1995 | Abbott et al. | 360/46 |
| 5,422,895 | 6/1995 | Nguyen et al. | 371/37.5 |
| 5,544,178 | 8/1996 | Kook | 371/43 |
| 5,602,857 | 2/1997 | Zook et al. | 371/40.1 |
| 5,691,993 | 11/1997 | Fredrickson | 371/38.1 |

FOREIGN PATENT DOCUMENTS

| | | |
|---|---|---|
| 0322078 | 6/1989 | European Pat. Off. . |
| 0364229 | 4/1990 | European Pat. Off. . |

OTHER PUBLICATIONS

Thapar et al., "On the Performance of a Rate 8/10 Matched Spectral Null Code for Class–4 Partial Response", IEEE Transactions on Magnetics, vol. 28, No. 5, Sep. 1992, pp. 2883–2888.

Fredrickson et al., "Improved Trellis–Coding for Partial–Response Channels", IEEE Transactions on Magnetics, vol. 31, No. 2, Mar. 1995, pp. 1141–1148.

Rae et al., "Design and Performance of a VLSI 120 Mb/s Trellis–Coded Partial Response Channel", IEEE Transactions on Magnetics, vol. 31, No. 2, Mar. 1995, pp. 1208–1214.

Cideciyan et al., "Codes Preventing Quasi–Catastrophic Error Propagation in Partial–Response Systems", IEEE Transactions on Information Theory, vol. 41, No. 2, Mar. 1995, pp. 600–604.

*Primary Examiner*—Stephen M. Baker
*Attorney, Agent, or Firm*—Shawn B. Dempster; Edward P. Heller; Jonathan E. Olson

[57] ABSTRACT

A digital communication apparatus (20) transmits sectors of digital values that include error correction values used to detect and correct errors within the sector. Each sector consists of a number of blocks (70, 72, 74) and the error correction values of each block (70) are useful in correcting up to a maximum number of erroneous digital units (78, 84) in that block (70). The digital communication apparatus (20) encodes the blocks of digital units to transmit them through a channel (32) and then decodes the channel's representation of those encoded blocks, where the channel's representation occasionally contains burst errors. The encoding and decoding is performed in a manner that reduces the number of consecutive erroneous digital units caused by any one burst error to a number less than the number of

15 Claims, 9 Drawing Sheets

TRELLIS CODE WITH IMPROVED ERROR PROPAGATION

CROSS-REFERENCE TO RELATED APPLICATION

This application is a continuation-in-part of application Ser. No. 08/483,117; filed Jun. 7, 1995, now U.S. Pat. No. 5,691,993.

BACKGROUND OF THE INVENTION

The present invention relates to digital communication systems and more particularly to digital communication systems that use multiple levels of encoding to protect user data as it passes through a noisy communications channel.

Digital communication systems are designed to transmit user data from a source to a destination. The means connecting the source and destination can be a simple conducting wire, a global satellite system or a magnetic storage system. The connecting means is often generalized as a channel between the source and destination.

All channels occasionally introduce electronic noise into the signals they carry. This electronic noise changes the digital signal and thus creates errors within the digital signal. To protect the digital signals as they pass through the channel, encoding and decoding systems have been developed that add additional bits to the digital signal so that the original signal may be recovered even if the channel introduces errors. In some communication systems, multiple levels of encoding are used, meaning that the original digital signal is encoded more than once before being passed through the channel.

An example of a multiple-level encoding system is found in the encoding system used in some magnetic storage devices. In these systems, the user data is first encoded using an error correction code (ECC) and then further encoded using some form of trellis code. In the ECC encoding process, the user data is typically broken into bytes of digital values where each byte represents one unit of user data. For example, user data may be grouped together in blocks containing 175 bytes of user data and 5 bytes of ECC redundancy. The 5 bytes of ECC redundancy are chosen based on the digital values found in the 175 user bytes. Typically, 5 bytes of ECC redundancy can correct up to two erroneous user bytes in each block. The ECC encoding system is completed by interleaving three separate blocks in a sector containing 540 bytes, so that the complete set of user bytes and ECC bytes for any one block can be found by sampling every third byte of the interleaved output.

Interleaving reduces the effects of burst errors on the ECC encoded signal. Burst errors are localized error events affecting one or more consecutive user words. By ensuring that consecutive words in the ECC encoded signal are not from the same block, interleaving reduces the chance that a burst error will affect more than one byte in a block. Since ECC can only correct two user bytes per block, interleaving reduces the chances that a burst error will exceed the maximum number of user bytes that ECC can correct.

In prior art coding methods for magnetic storage devices, the interleaved ECC encoded values are further encoded by two parallel trellis encoders. Each of the two parallel trellis encoders typically produces a spectral null code, also referred to as a DC free or DC null code, whose encoded data stream has a spectral null at zero frequency. The outputs of the two trellis encoders are interleaved together to create a signal that has both a DC null and a null at the Nyquist frequency, i.e., at half the channel bit frequency. Input signals that have a spectral null at D.C. and the Nyquist frequency are preferred because they match the spectral response of a disc drive channel equalized to class-IV partial response (PR4), and this improves the destination's ability to recover encoded signals from the channel.

In the prior art, the interleaved ECC encoded values are assigned to the parallel trellis encoders by first assigning the even bytes to one trellis encoder and the odd bytes to the other trellis encoder. Each trellis encoder then uses 12 bits at a time from the stream of bytes assigned to it to create codewords. This means that each trellis encoder uses one full byte and one half byte of the ECC encoded bytes to create one codeword. Thus, the odd byte trellis encoder uses all of byte 1 and half of byte 3 of the ECC encoded bytes to make a first odd stream codeword and the other half of byte 3 and all of byte 5 to make a second odd stream codeword. Likewise, the even byte trellis encoder uses all of byte 0 and half of byte 2 to make a first even stream codeword.

The codewords produced by each trellis encoder are created in parallel so that the bits of the two parallel codewords may be interleaved at the encoder's outputs. The series of interleaved codewords passes through the channel where it is occasionally corrupted by burst errors. The burst errors usually affect two or more consecutive bits and, because of the interleaving, corrupt two or more codewords.

After the channel, a deinterleaver reconstitutes the codewords and sends the individual codewords to detectors to be decoded into approximations of the ECC encoded signal. Since each pair of interleaved codewords is constructed from four bytes of ECC encoded data, the corruption of a pair of interleaved codewords by a burst error results in the corruption of four bytes of data. For example, one corrupted codeword may corrupt bytes 1 and 3 and the other corrupted codeword may corrupt bytes 0 and 2. The fact that a single burst error can corrupt four separate bytes is significant because the ECC encoded signal is created using a three-way interleave. Every third byte of the ECC encoded signal is from a single block of ECC encoded information. Thus, in the example above, corrupted bytes 0 and 3 are from the same block. This means that one burst error can corrupt two bytes from the same block. Because ECC can only correct two erroneous bytes in a block, this one burst error has consumed the ECC's entire ability to correct corrupted data. If two burst errors occur, corrupting a total of four codewords, the ECC decoder will not be able to correct the corrupted data because more than two bytes of ECC encoded data will be corrupted in a single ECC block.

SUMMARY OF THE INVENTION

The present invention is a digital communication apparatus for transmitting sectors of digital bytes through a channel. Each sector contains a number of error correction coded blocks, each of which contain error correction bytes used to detect and correct errors within the block. The error correction system is capable of correcting up to a maximum number of erroneous bytes per block. The digital communication apparatus includes an encoding system that encodes the blocks of digital bytes so that a single burst error in the channel corrupts at most one byte in each block.

In one preferred embodiment, the present invention uses a multi-level encoding scheme where the first level of encoding uses an ECC encoder with three-way bytewise interleave. The three-way bytewise interleave combines bytes from three different ECC blocks so that every third byte is from the same block. Each block of the ECC encoded data contains ECC values that can correct up to two erroneous bytes in that block.

The second level of encoding uses two parallel 12/15 trellis encoders. Each trellis encoder takes 12 bits from the ECC encoder and produces a 15-bit codeword. The two 15-bit codewords are then bitwise interleaved.

Since each trellis encoder needs 12 bits of ECC encoded data to produce one codeword, 24 bits of ECC encoded data are needed to produce the two interleaved codewords. The present invention ensures that all twenty-four bits come from only three bytes of ECC encoded data.

With the present invention, a burst error that corrupts two interleaved codewords corrupts at most 3 bytes of ECC encoded data. Since each of the 3 bytes is part of a separate ECC block, the burst error only affects one byte in each block. Since the ECC system can correct up to two corrupted bytes, the present invention can correct data corrupted by as many as two burst errors. Thus, the present invention can accept twice as many burst errors in the channel as the prior art.

DETAILED DESCRIPTION OF THE PREFERRED EMBODIMENTS

Figure 1:
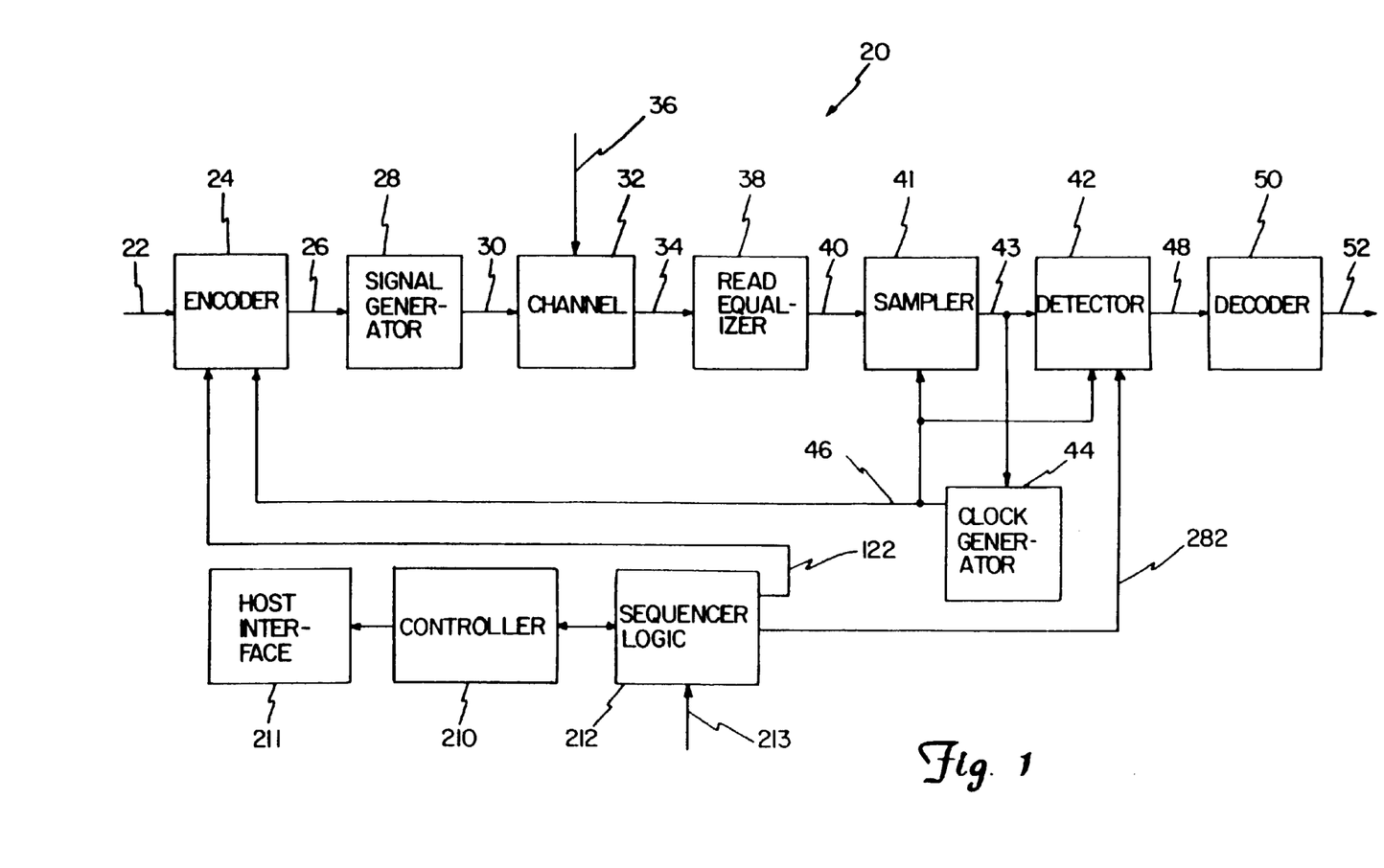
FIG. 1 is a block diagram of a digital communication system of the present invention.

FIG. 1 is a block diagram of a preferred embodiment of the present invention in which the present invention is utilized in a direct access storage device, such as a magnetic disc drive. Digital communication apparatus 20 receives USER DATA 22, passes it through a channel 32 and retrieves it as RECOVERED DATA 52. When used in a magnetic disk drive, channel 32 is a magnetic disk where information is written to the magnetic disk by altering localized magnetic fields on the disk and where information is read from the disk by sensing the localized magnetic fields.

Typically, the disk drive contains a microprocessor or state machine controller 210 to control the reading and writing processes. Controller 210 communicates bidirectionally with a host interface 211, and sequencer logic 212. Under user control from host interface 211, and receiving various signals from the disk drive such as INDEX 213, a signal which provides the orientation of the spinning disk, controller 210 causes sequencer logic 212 to provide control signals for writing and reading the appropriate section of the disk. Sequencer logic 212 enables writing through WRITEGATE signal 122, and reading through READGATE signal 282.

USER DATA 22 is received by encoder 24 which encodes the user data to make it easier to recover the data from channel 32. Encoder 24 produces ENCODED DATA 26 based upon an encode rule appropriate for channel 32. The encode rule is chosen as a balance between recoverability and transmission efficiency. Enough code bits should be added to ensure recovery of USER DATA 22, but the encode rule should not fill the channel with excess code bits.

Signal generator 28 converts ENCODED DATA 26 into WRITE signal 30, which is an input waveform proper for channel 32. In the case of a magnetic storage device, channel 32 includes a means for writing and reading magnetic information to and from a magnetic disk. The magnetic information written to the disk is based upon WRITE signal 30. The information read from the disk is found in READ signal 34, the output of channel 32. Due to imperfections in the magnetic disk and errors in writing and reading, channel 32 introduces NOISE 36 into READ signal 34. This noise usually occurs in short bursts and often affects a short series of consecutive values in READ signal 34.

READ signal 34 is input to read equalizer 38 which modifies READ signal 34 by filtering some noise and by shaping the pulses of READ signal 34 so that they more closely match a PR 4 channel output. In a perfect PR 4 channel, the output signal is equal to the input signal minus the input signal delayed by two time units. This relationship is sometimes described using the transform $h(D)=(1-D^2)$ where "1" is the input signal and $D^2$ is the input signal delayed by two time units. In magnetic disc drives, the channel output is similar to a PR4 channel output. Read equalizer 38 simply improves upon this output to create a more ideal PR4 signal. The PR4 channel output of read equalizer 38 is EQUALIZED signal 40 which is input to sampler 41.

Sampler 41 receives BIT CLOCK 46 from clock generator 44, and samples EQUALIZED signal 40, to produce one digital sample per clock cycle. Each digital sample is preferably taken from the center of an expected data bit in EQUALIZED signal 40. The series of digital samples produced by sampler 41 is output as DIGITAL SAMPLES 43.

Clock generator 44 uses DIGITAL SAMPLES 43 to create BIT CLOCK 46. In a disc drive, clock generator 44 typically contains timing control logic that synchronizes itself to pulses created by read synchronization fields stored on the magnetic disk. The pulses create a fixed frequency pattern in EQUALIZED signal 40 and DIGITAL SAMPLES 43. This fixed frequency is used by the timing logic to set the phase and frequency of BIT CLOCK 46 so that it matches the phase and frequency of the data bits stored on the disk.

Detector 42 receives DIGITAL SAMPLES 43 and BIT CLOCK 46 and uses the digital samples to select codewords that the series of samples most likely represent. The samples are usually in the form of an imperfect PR4 channel output. They are imperfect because they are often corrupted by NOISE 36 in channel 32. Detector 42 reconstructs codewords from these imperfect samples by comparing the series of samples against possible codewords and selecting the most similar codeword. The technique for performing this comparison is discussed further below. Once Detector 42 has selected a codeword it passes the codeword to decoder 50 along SELECTED CODEWORDS 48.

Decoder 50 uses the inverse of encode rules of encoder 24 to decode each codeword in SELECTED CODEWORDS 48. The decoding is synchronized with the production of SELECTED CODEWORDS 48 by BIT CLOCK 46. This decoding process produces RECOVERED DATA 52.

Figures 2, 3:
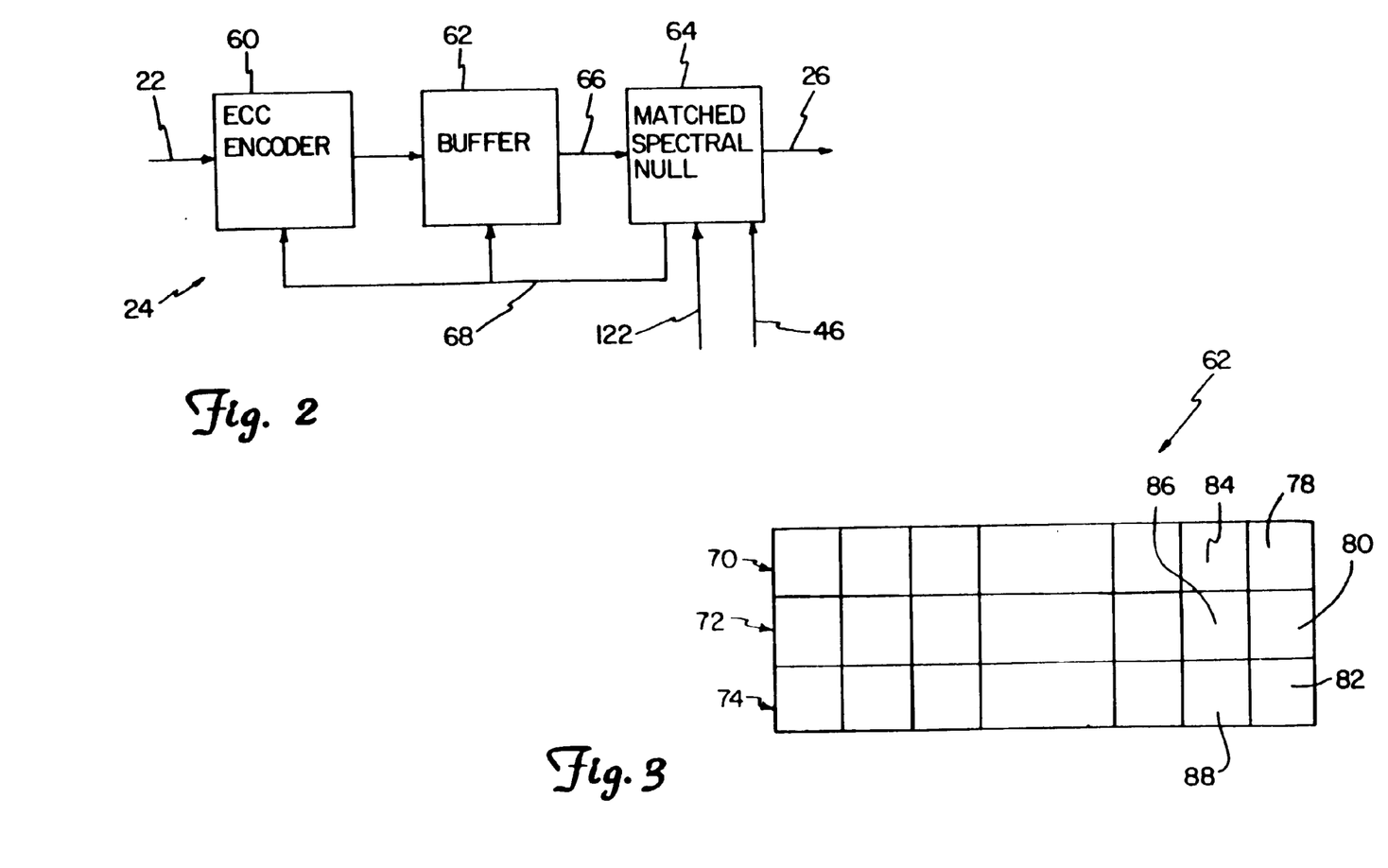
FIG. 2 is a block diagram of encoder 24 of FIG. 1.
FIG. 3 is a matrix of the contents of buffer 62 of FIG. 2

FIG. 2 shows a more detailed block diagram of encoder 24 of FIG. 1. USER DATA 22 received by encoder 24 is input to ECC encoder 60. ECC encoder 60 divides the user data into bytes of data and creates ECC coded bytes based on these bytes. In one preferred embodiment, ECC encoder 60 creates 5 bytes of ECC code-bits for every 175 bytes of user data. ECC encoder 60 stores the user data bytes and the ECC code-bits in a buffer 62. In one preferred embodiment, buffer 62 has two storage areas. While information is being written to one storage area, stored information is being read from the other storage area. ECC encoder 60 preferably stores 525 user bytes and 15 ECC bytes in each area of buffer 62.

The user data and ECC bytes stored in buffer 62 are passed to matched spectral null encoder 64 as INTERLEAVED ECC DATA 66. The values from buffer 62 are interleaved in a manner described below in reference to FIG. 3.

Matched spectral null encoder 64 receives BIT CLOCK 46 from clock generator 44 and WRITEGATE 122 from sequencer logic 212 of FIG. 1 and uses the bit clock to generate BYTE CLOCK 68 that controls the timing of the bytes in INTERLEAVED ECC DATA 66. BYTE CLOCK 68 also controls the production of bytes by ECC encoder 60. Matched spectral null encoder 64 encodes the values from INTERLEAVED ECC DATA 66 into a series of interleaved codewords that appear in ENCODED DATA 26. The encoding is performed in such a manner that in the preferred embodiment only three bytes of INTERLEAVED ECC DATA 66 are used in the production of two interleaved codewords. Because of this limitation, if a channel burst error compromises two interleaved codewords, it will only affect three bytes of INTERLEAVED ECC DATA 66.

FIG. 3 is a representation of one storage area in buffer 62. In the representation, buffer 62 is divided into rows and columns of memory locations, each memory location capable of storing one byte of information. Rows 70, 72 and 74 each represent separate blocks of data bytes and associated ECC bytes. In the preferred embodiment of the present invention, each block contains 175 bytes of user data and 5 bytes of ECC values. The 5 bytes of ECC values are capable of correcting up to two erroneous bytes in any one block. Thus, the 5 bytes of ECC values in row 70 can correct up to two erroneous bytes of user data in row 70.

To create INTERLEAVED ECC DATA 66 from the values stored in buffer 62, bytes of data and ECC values are retrieved from buffer 62 in the following sequence. The first byte in row 70 marked as user byte 70 becomes the first byte on INTERLEAVED ECC DATA 66. The first data byte in row 72, marked as user byte 80 becomes the second byte read from buffer 62. The third byte is user byte 82 from row 74. This process of taking one byte from each of the three rows continues in the next bytes where user bytes 84, 86 and 88, taken from rows 70, 72, and 74 become the fourth, fifth and sixth bytes respectively. This process continues until all of the user bytes and all of the ECC bytes have been interleaved and sent to matched spectral null encoder 64.

Figure 4:
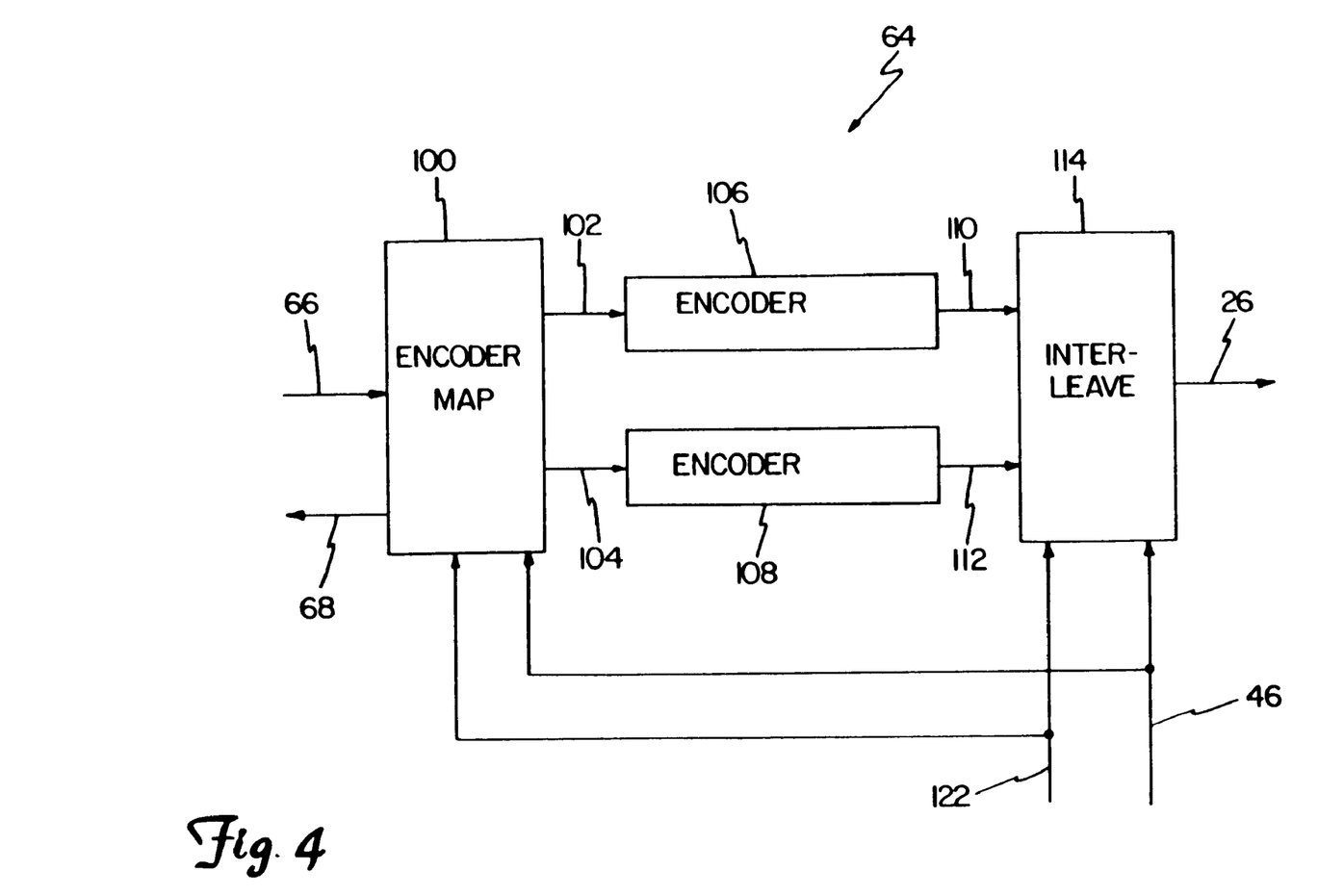
FIG. 4 is a block diagram of matched spectral null encoder 64 of FIG. 2

FIG. 4 is a block diagram of matched spectral null encoder 64 of FIG. 2. An encoder map 100 receives INTERLEAVED ECC DATA 66 from buffer 62, as well as BIT CLOCK 46 from clock generator 44 and WRITEGATE 122 from sequencer logic 212. Encoder map 100 uses BIT CLOCK 46 to generate BYTE CLOCK 68 and divides INTERLEAVED ECC DATA 66 into two separate data streams, TOP STREAM 102 and BOTTOM STREAM 104. TOP STREAM 102 is input to top encode rule 106 and BOTTOM STREAM 104 is input to bottom encode rule 108. Top encode rule 106 and bottom encode rule 108 are preferably identical to each other and encode the signals in their respective streams in an identical manner. As a result of this encoding, top encode rule 106 produces TOP CODED STREAM 110 and bottom encode rule 108 produces BOTTOM CODED STREAM 112.

TOP CODED STREAM 110 and BOTTOM CODED STREAM 112 are input to interleaver 114, which also receives BIT CLOCK 46 and WRITEGATE 122. Interleaver 114 interleaves the bits of TOP CODED STREAM 110 with the bits of BOTTOM CODED STREAM 112 and outputs the interleaved stream as ENCODED DATA 26 at a rate set by BIT CLOCK 46. The interleaving is such that ENCODED DATA 26 is constructed from alternating bits of TOP CODED STREAM 110 and BOTTOM CODED STREAM 112.

Figure 5:
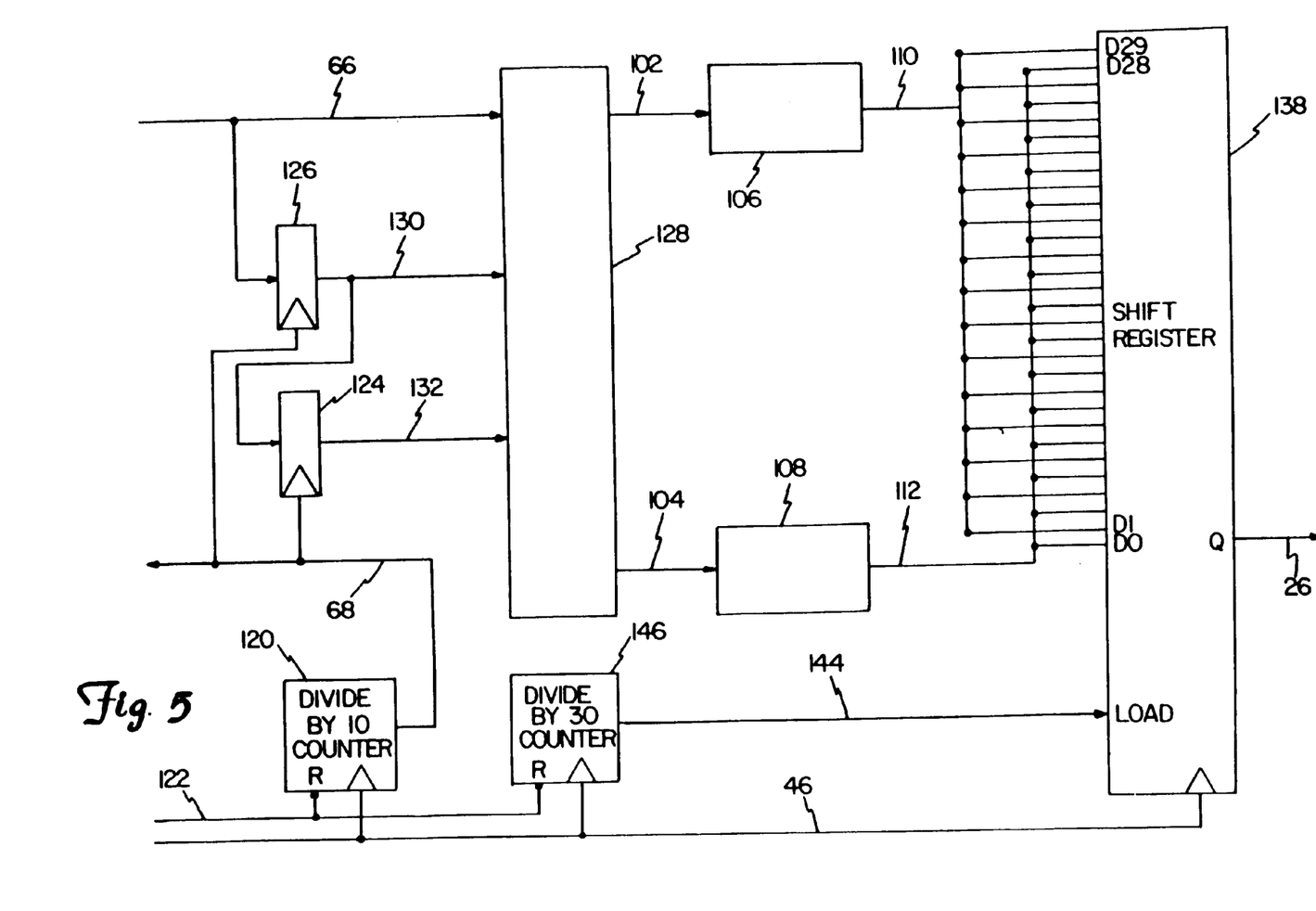
FIG. 5 is a more detailed diagram of matched spectral null encoder 64 of FIGS. 2 and 4.

FIG. 5 is a preferred embodiment of matched spectral null encoder 64 of FIG. 4. In this embodiment, encoder map 100 of FIG. 4 is constructed from first-byte register 124, second-byte register 126, partitioner 128, and divide-by-ten counter 120.

Divide-by-ten counter 120 is driven by BIT CLOCK 46 and is reset by the inverse of WRITEGATE 122 of FIG. 1. For every ten pulses on BIT CLOCK 46, divide-by-ten counter 120 produces one pulse on BYTE CLOCK 68, which controls the loading of first-byte register 124 and second-byte register 126. Under the control of BYTE CLOCK 68, INTERLEAVED ECC DATA 66 enters matched spectral null encoder 64 on an eight-bit bus, one byte per BYTE CLOCK cycle. The eight-bit bus is connected to partitioner 128 and the input of second-byte register 126. At the first pulse of BYTE CLOCK 68, the first byte of data on INTERLEAVED ECC DATA 66 is loaded into second-byte register 126. After a short propagation delay, this value appears at second-byte bus line 130, which is the eight-bit bus output of second-byte register 126. Second-byte bus line 130 is input to partitioner 128 and first-byte register 124.

With the next pulse on BYTE CLOCK 68, the byte value on second-byte bus line 130 is loaded into first-byte register 124 and after a short propagation delay appears on first-byte bus line 132, which is the eight-bit bus output of first-byte register 124. This BYTE CLOCK pulse also causes the next byte on INTERLEAVED ECC DATA 66 to be loaded into second-byte register 126 and, after a short delay, this next byte appears on second-byte bus line 130. This pulse on BYTE CLOCK 68 also prompts buffer 62 for another byte of data which passes onto INTERLEAVED ECC DATA 66 after the previous byte appears on second-byte bus line 130.

At this point, first-byte bus line 132, second-byte bus line 130, and INTERLEAVED ECC DATA 66, together carry a set of three bytes that appeared consecutively on INTERLEAVED ECC DATA 66. These three bytes are input in parallel into partitioner 128 and together form 24 bits of data and/or ECC values. These 24 bits are divided by partitioner 128 into two 12 bit words that are placed on TOP STREAM 102 and BOTTOM STREAM 104 respectively. TOP STREAM 102 and BOTTOM STREAM 104 are 12-bit bus lines that are input to top encode rule 106 and bottom encode rule 108 respectively. The two encode rules encode each 12-bit word into a 15-bit codeword to produce TOP CODED STREAM 110 and BOTTOM CODED STREAM 112 which are carried on 15-bit bus lines. The encode rules preferably apply a NRZ coding scheme where each "1" in the codeword represents one direction of magnetization on the disk, and each "0" represents an opposite direction of magnetization. For reference, the directions of magnetization are referred to as the "+1" and "−1" directions.

Each codeword within TOP CODED STREAM 110 and BOTTOM CODED STREAM 112 is input to shift register 138 which acts as interleaver 114 of FIG. 4. The 15-bit bus line of TOP CODED STREAM 110 is interleaved with the 15-bit bus line of BOTTOM CODED STREAM 112 at the inputs of shift register 138. Thus, input D0 is the first bit of BOTTOM CODED STREAM 112 and D1 is the first bit of TOP CODED STREAM 110. Likewise, D28 is the last bit of BOTTOM CODED STREAM 112 and D29 is the last bit of TOP CODED STREAM 110.

The values of TOP CODED STREAM 110 and BOTTOM CODED STREAM 112 are loaded into shift register 138 at each positive going transition received on LOAD 144 at the load input of shift register 138. LOAD 144 is created by divide-by-30 counter 146, which produces one positive going transition for every thirty pulses on BIT CLOCK 46. The shifting of shift register 138 is controlled by BIT CLOCK 46 which is received at the clock input of shift register 138. With each clock pulse on BIT CLOCK 46, the bits in shift register 138 shift one position towards the least significant bit where they are output from the shift register at serial output Q. After 30 pulse on BIT CLOCK 46, all 30 bits from the two 15-bit codewords of BOTTOM CODED STREAM 112 and TOP CODED STREAM 110 have been output through serial output Q. This produces ENCODED DATA 26, a serial, interleaved representation of the codewords on TOP CODED STREAM 110 and BOTTOM CODED STREAM 112.

Figure 6:
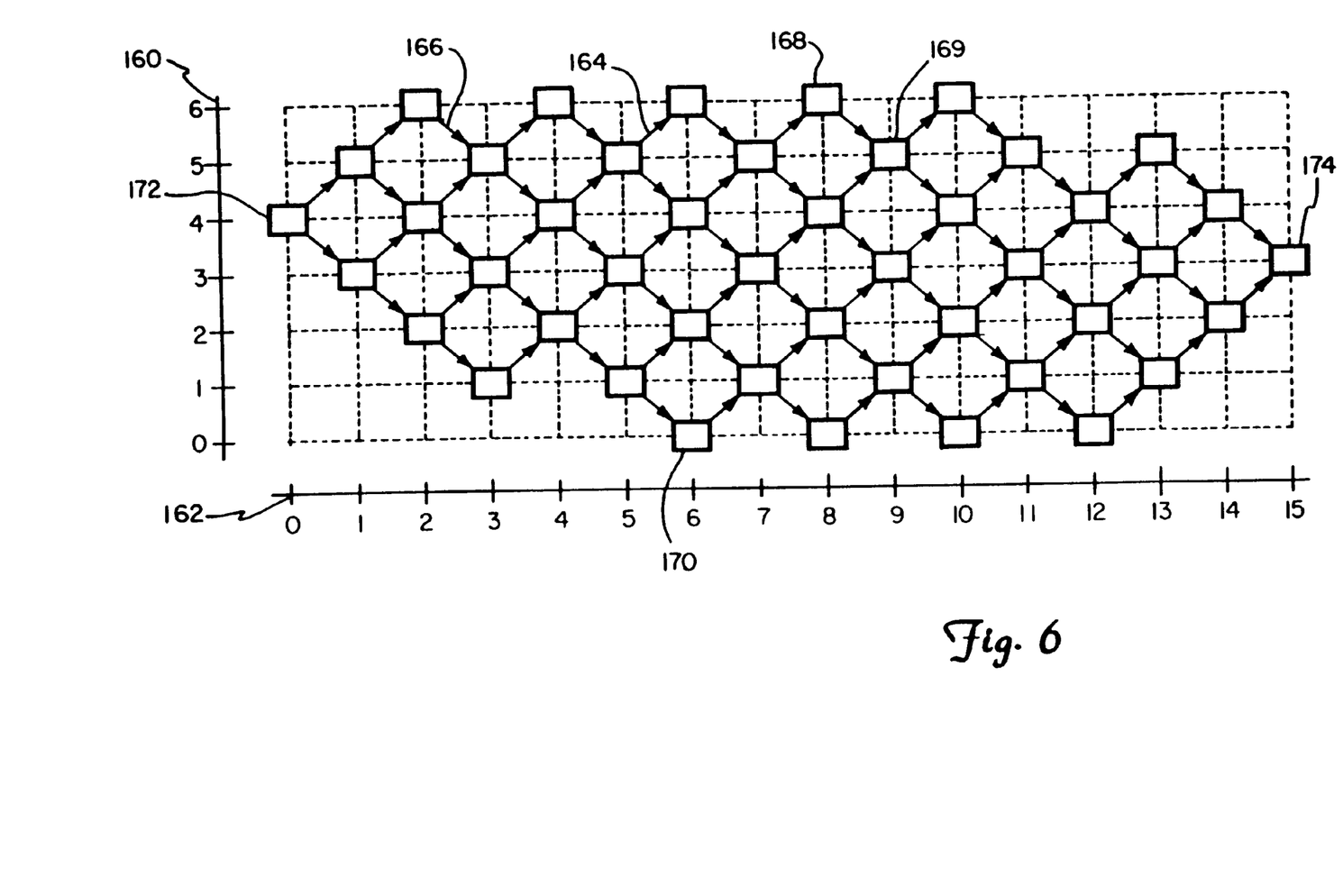
FIG. 6 is a trellis diagram demonstrating the encoder rules of encoders 106 and 108 of FIGS. 4 and 5.

FIG. 6 is one embodiment of a trellis diagram for the encode rule found in top encode rule 106 and bottom encode rule 108 of FIG. 5. The trellis diagram has a vertical axis 160 that has values from zero to six representing a running digital sum. Horizontal axis 162 represents 15 time periods with one digit of the 15 bit codeword being decided at each time period. The boxes shown in FIG. 6 represent valid running digital sum values at each time. The arrows between boxes represent valid transitions from one time period to the next. Upward diagonal arrows, such as arrow 164, represent +1's at the channel input corresponding to one direction of magnetization on the disk. Downward diagonal arrows, such as arrow 166, represent −1's at the channel input corresponding to the opposite direction of magnetization. For each upward diagonal arrow, 1 is added to the running digital sum and for each downward diagonal arrow, 1 is subtracted from the running digital sum. The trellis of FIG. 6 has a running digital sum constraint that forbids the running digital sum from being greater than 6 or less than zero. Thus, in maximum state 168, the only allowable transition is to state 169, a transition that represents a −1 at the channel input and a reduction in the running digital sum. Similarly, the transition from minimum state 170 must produce a +1 so that the running digital sum will increase from 0 to 1.

Each unique path through the trellis of FIG. 6 represents one possible 15-bit codeword for each 12-bit data word used as input to the encode rules, with the exception that none of the codewords may have a string of six identical values. The generation of each codeword begins with a running digital sum of four at state 172 and ends with a running digital sum of three at state 174. Because there are 15 bits in each codeword, there will always be an unequal number of "+1's" and "−1's" represented by each codeword. Specifically, there will be 8 "−1's" and 7 "+1's" represented in each codeword produced by trellis 163 of FIG. 6.

The distribution of "+1's" and "−1's" in ENCODED DATA 26 determines the spectral response of the trellis code. The spectral response is a running digital sum produced by sampling ENCODED DATA 26 at different frequencies. For a PR 4 channel, it is preferred that ENCODED DATA 26 have a running digital sum of zero at DC, which samples every bit, and at the Nyquist frequency, which samples every other bit. A running digital sum of zero is usually referred to as a spectral null, since it has no value at that frequency.

Because each codeword produced by trellis 163 represents one more −1 than +1, its spectral response has a spike at DC instead of a DC null. If the codewords from both trellis encoders were simply interleaved to produce ENCODED DATA 26, that interleaved signal would have a spectral response with a spike at both DC and the Nyquist frequency.

To remove these spikes, the present invention inverts the binary values of every other codeword from top encode rule 106 and bottom encode rule 108. In addition, it is preferred that the inverted codewords also be reversed so that the last bit becomes the first bit in the codeword. Inverting the codewords makes the number of "+1's" and "−1's" equal over any two consecutive codewords from a particular encoder. This introduces a null into the channel input at DC and the Nyquist Frequency. The inversion and reversal is performed within top encode rule 106 and bottom encode rule 108 of FIG. 5.

Figure 7:
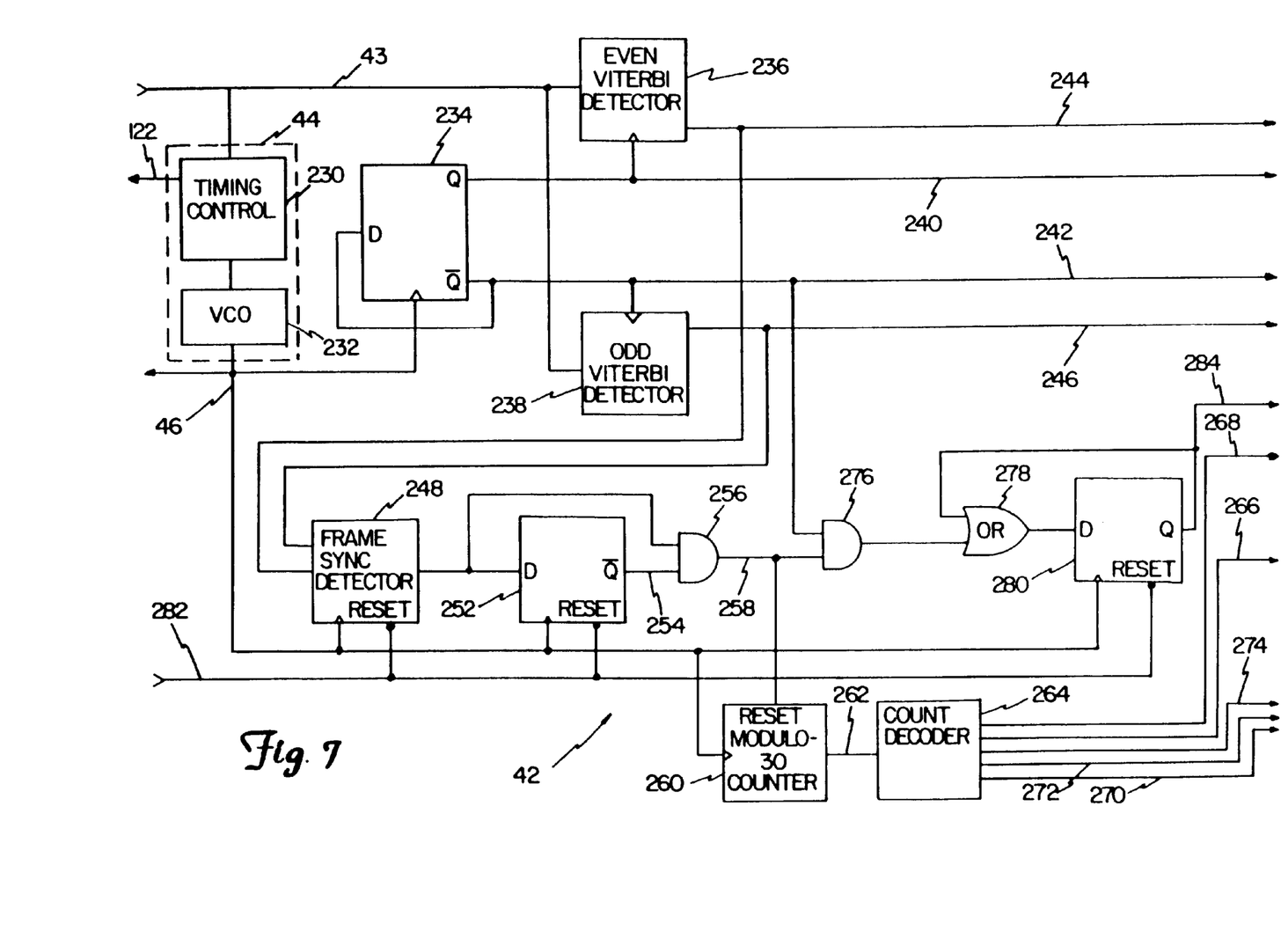
FIG. 7 is a diagram of one embodiment of clock generator 44 and detector 42 of FIG. 1.

FIG. 7 is one embodiment of clock generator 44 and detector 42 of FIG. 1. Clock generator 44 contains timing control 230 and Voltage Controlled Oscillator (VCO) 232, which together create BIT CLOCK 46. Sequencer logic 212 provides READGATE 282, which rises during a synchronization field, with a fixed frequency of transitions, and timing control 230 uses this fixed frequency to set a voltage to control VCO 232. Specifically, timing control 230 creates a control voltage that controls the frequency of a clock signal produced by VCO 232. Once synchronized, this clock signal becomes BIT CLOCK 46.

Detector 42 uses two parallel Viterbi detectors and synchronization logic to detect codewords in DIGITAL SAMPLES 43. The two parallel Viterbi detectors, Even Viterbi Detector 236 and Odd Viterbi Detector 238, receive DIGITAL SAMPLES 43 on five-bit or six-bit input buses and output a series of codewords on 15-bit buses. The detection is synchronized, in part, by EVEN CLOCK 240 and ODD CLOCK 242 which are tied to the enable inputs of Even Viterbi Detector 236 and Odd Viterbi Detector 238 respectively. Both EVEN CLOCK 240 and ODD CLOCK 242 are created by divide-by-two clock 234 which creates the signals by dividing the frequency of BIT CLOCK 46 in half. Divide-by-two clock 234 is simply a D-flip-flop with its clock input tied to BIT CLOCK 46 and its inverse-output, $\overline{Q}$, tied to its D input. This design causes divide-by-two clock 234 to flip-flop with every positive transition in BIT CLOCK 46.

The output, $\overline{Q}$, is EVEN CLOCK 240 and the inverse-output Q, is ODD CLOCK 242. Because the EVEN and ODD clocks are inverses of each other, they enable Even Viterbi Detector 236 and Odd Viterbi Detector 238 on an alternating basis. When EVEN CLOCK 240 is high, Even Viterbi Detector 236 is enabled and Odd Viterbi Detector 238 is disabled; when ODD clock 242 is high, Odd Viterbi Detector 238 is enabled and Even Viterbi Detector 236 is disabled.

When a Viterbi Detector is enabled, it will accept a new sample from DIGITAL SAMPLES 43. Since each Viterbi Detector is only enabled on every other pulse of BIT CLOCK 46, each will only accept alternating samples from DIGITAL SAMPLES 43. For instance, Even Viterbi Detector 236 receives samples 0, 2, 4, 6, 8 . . . and Odd Viterbi Detector 238 receives samples 1, 3, 5, 7 . . . Thus, divide-by-two clock 243 acts as a deinterleaver that separates the pairs of bitwise interleaved codewords found in DIGITAL SAMPLES 43.

Before being deinterleaved, the signal on DIGITAL SAMPLES 43 preferably matches a PR 4 channel output denoted as $(1-D^2)$ where 1 is the input signal and $D^2$ is the input signal delayed by two BIT CLOCK pulses. Such a signal is the same as two interleaved (1-D) signals, where D represents one delay. Thus, after deinterleaving, each Viterbi detector receives a noisy (1-D) channel signal at its input.

Even Viterbi Detector 236 and Odd Viterbi Detector 238 produce EVEN CODEWORDS 244 and ODD CODEWORDS 246, respectively, which are input to frame sync detector 248 and decoder 50 of FIG. 1.

During the period when the transducer is over a synchronization region of the magnetic disc, frame sync detector 248 uses values from the two Viterbi Detectors to synchronize the detection and decoding of codewords in the data region of the disc. Frame sync detector 248 monitors the outputs of the detectors during this period to determine if the current DIGITAL SAMPLE is the last sample in the frame sync region of the disc. If it is the last sample, frame sync generator 248 sets its output, SYNC_FOUND 250, high.

SYNC_FOUND 250 passes to D-FLIP-FLOP 252 and AND-gate 256, which work together to convert the single positive-going transition on SYNC_FOUND 250 into a pulse. SYNC_FOUND 250 is tied to the D-input of D-FLIP-FLOP 252, which receives BIT CLOCK 46 at its clock input. The rising edge of SYNC_FOUND 250 is synchronized with the rising edge of BIT CLOCK 46 so that D-FLIP-FLOP 252 does not capture the change in SYNC_FOUND 250 until the next rising edge of BIT CLOCK 46. This delays the transition at the output of D-FLIP-FLOP 252 for one BIT CLOCK period. After that delay, the inverse output, $\overline{Q}$254, of D-FLIP-FLOP 252 becomes low.

AND-gate 256, which receives both SYNC_FOUND 250 and Q 254, combines the two signals to create a pulse. When SYNC_FOUND 250 goes high, $\overline{Q}$254 is already high forcing the output of AND-gate 256, STARTCNT 258, high. After the delay created by D-FLIP-FLOP 252, Q 254 goes low and STARTCNT 258 returns low. This creates a pulse on STARTCNT 258 that is one BIT CLOCK period wide.

The rising edge of STARTCNT 258 resets Modulo-30 counter 260, which repeatedly counts from zero to twenty-nine. The count is controlled by BIT CLOCK 46 which is tied to the clock input of module-30 counter 260 causing the counter to increment once for each sample in DIGITAL SAMPLES 43. When module-30 counter 260 is reset, count zero begins at the first bit of two interleaved codewords in DIGITAL SAMPLES 43. At count 29, thirty counts after module-30 counter 260 was reset, the sample in DIGITAL SAMPLES 43 represents the last bit of the two interleaved codewords. This relationship is repeated for each pair of interleaved codewords in DIGITAL SAMPLES 43.

The count on module-30 counter 260 is output on a five-bit bus line 262 that is input to a count decoder 264. The count decoder produces five separate outputs that have high values during particular counts. For instance, 28_CNT 266 is high during the time period when the count on module-30 counter 260 is 28, otherwise 28_CNT 266 is low. Similarly, 29_CNT 268, 23_CNT 270, 13_CNT 272, and 3_CNT 274 are high when the count is 29, 23, 13 and 3 respectively, but otherwise, these signals are low.

The pulse on STARTCNT 258 is input to AND-gate 276 along with ODD CLOCK 242. If the pulse on STARTCNT 258 occurs at the same time ODD CLOCK 242 is high, the output of AND-gate 276 will be high. This will only occur when the last bit of the frame sync found in the servo region is fed to Odd Viterbi Detector 238. If the last bit of the frame sync is sent to Odd Viterbi Detector 238, then the first data bit will be sent to Even Viterbi Detector 236 and, in fact, the first codeword of each pair of interleaved codewords will be detected by Even Viterbi Detector 236 while the second codeword of each pair will be detected by Odd Viterbi Detector 238.

The output from AND-gate 275 is input to OR-gate 278 along with the output of D-FLIP-FLOP 280. D-FlIP-FLOP 280 and OR-gate 278 act together as a register, trapping high values found at the output of AND-gate 276. As soon as AND-gate 276's output becomes high, OR-gate 278 passes the high value to the D-input of D-FLIP-FLOP 280 which passes the value to its output, EVEN_FIRST 284. Since this output is then fed back to the D-input of D-FLIP-FLOP 280 by way of OR-gate 278, D-FLIP-FLOP 280 retains this high value until it is reset.

Since EVEN_FIRST 284 is set high when the first data bit is being fed to Even Viterbi Detector 236, EVEN_FIRST can be used to determine if the first codeword is on Even Viterbi Detector 236 or Odd Viterbi Detector 238. If EVEN_FIRST is high, the first codeword of each interleaved pair of codewords will be detected by Even Viterbi Detector 236. If EVEN_FIRST is low the first codeword will be detected by Odd Viterbi Detector 238.

D-FLIP-FLOP 280, D-FLIP-FLOP 252, and frame sync detector 248 are all reset by the inverse of READGATE 282, a signal that is high during read operations. Thus, READGATE 282 resets the outputs of these devices; SYNC_FOUND 250, STARTCNT 258, and EVEN_FIRST 284, at each synchronization region marking a new sector. Within a sector, these signals remain constant, meaning that EVEN_FIRST 284 has the same value for an entire sector.

Figure 8:
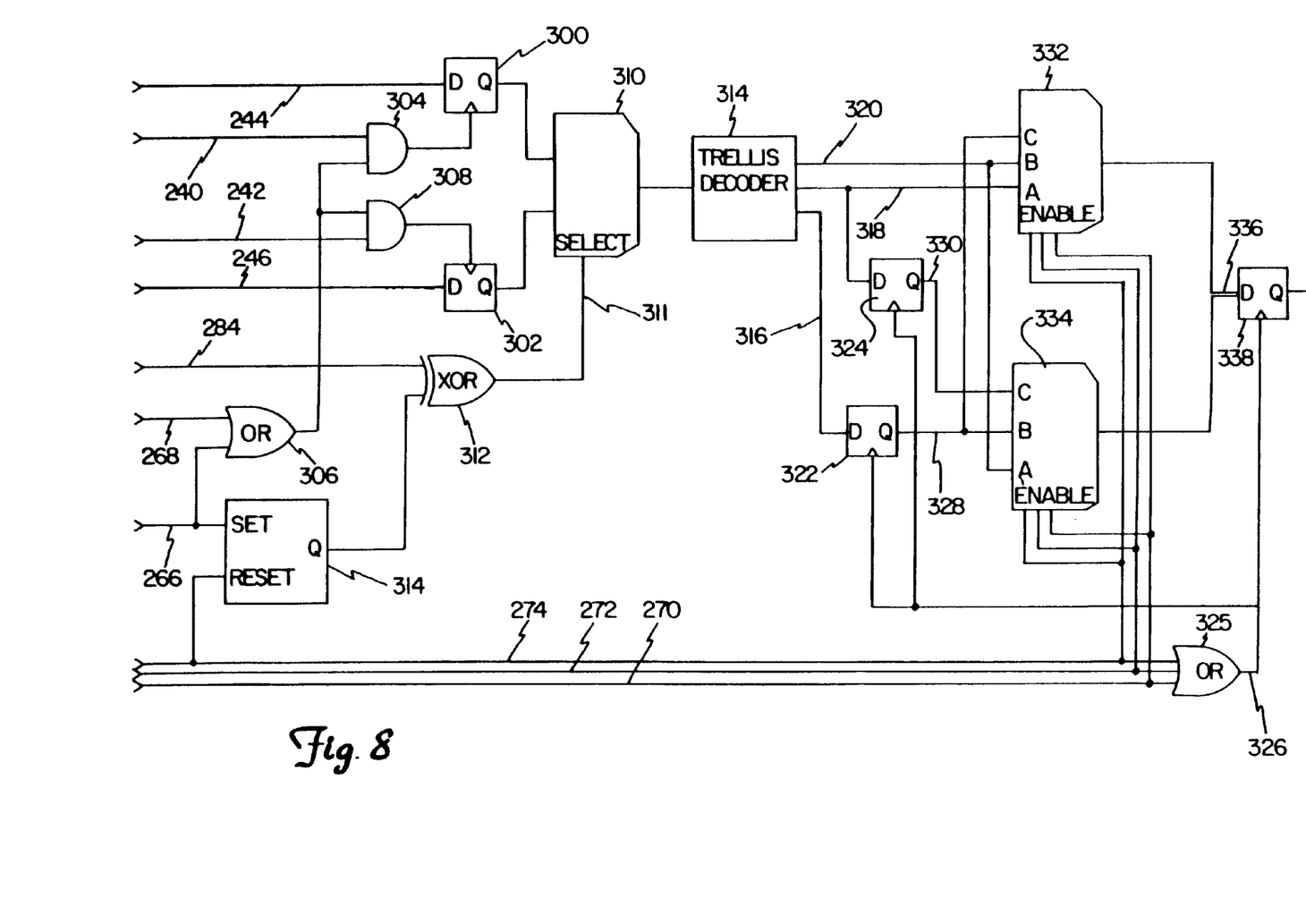
FIG. 8 is a diagram of one embodiment of decoder 50 of FIG. 1.

FIG. 8 is an embodiment of decoder 50 of FIG. 1 which can be used in conjunction with detector 42 of FIG. 7. The decoder receives detected codewords from the detector of FIG. 7 and decodes the codewords into a series of bytes of user data and ECC values. The codewords are received on EVEN CODEWORDS 244 and ODD CODEWORDS 246, with complete codewords arriving at count 28 or 29 of module-30 counter 260 of FIG. 7.

The full codewords on EVEN CODEWORDS 244 and ODD CODEWORDS 246 are received by and held in registers 300 and 302 respectively for a 30 count cycle of module-30 counter 260 of FIG. 7. The loading of registers 300 and 302 is controlled by the output of AND-gates 304 and 308 respectively. AND-gate 304 has one input tied to EVEN CLOCK 240 of FIG. 7, allowing the register to be loaded only during the sampling period of Even Viterbi Detector 236. Similarly, AND-gate 308 has one input tied to ODD CLOCK 242, allowing register 302 to be loaded at odd sampling periods. Both AND-gate 304 and AND-gate 308 have one input tied to the output of OR-gate 306, which performs a logical OR of 28_CNT 266, and 29_CNT 268 of FIG. 7. Thus, OR-gate 306 produces a high value when module-30 counter 260 of FIG. 7 reaches a count of 28 or 29, coinciding with the last bits in the two interleaved codewords. Under this control system, registers 300 and 302 load a new codeword at the last bits of each codeword in EVEN CODEWORDS 244 and ODD CODEWORDS 246, respectively.

The output of registers 300 and 302 are input to a 15-by-2 multiplexer 310 that selects one of the two inputs as its 15-bit output. The selection is controlled by SELECT signal 311 from Exclusive OR-gate 312. One input of Exclusive OR-gate 312 is EVEN_FIRST 284, which is high if the first codeword of two interleaved codewords is stored in (even) register 300 and low if the first codeword is stored in (odd) register 302. Thus, EVEN_FIRST 284 controls which register should be the first to pass its output through 15-by-2 multiplexer 310. The other input to Exclusive-or-gate 312 is tied to the output of register 314 which controls the period of time each register, 300 and 302, is selected to pass its values through 15-by-2 multiplexer 310. The output of register 314 is set high by a positive transition in 28_CNT 266 and is set low by a positive transition in 3_CNT 274. Thus, the output of register 314 selects one codeword for counts "29", "0", "1", "2" and "3" and the other codeword for all other counts. Working together, the two inputs of Exclusive-OR-gate 312 causes 15-by-2 multiplexer 310 to pass the first codeword of each interleaved pair during the counts of "29", "0", "1", "2" and "3", and the second codeword of each interleaved pair second, during the remaining counts.

The output of 15-by-2 multiplexer 310 is a 15-bit line that is input to Trellis Decoder 314. Each codeword is decoded by Trellis Decoder 314 according to the inverse of encode rules of FIG. 4. Based on the encode rules, Trellis Decoder 314 produces twelve bits of user data and ECC values for each codeword. These twelve bits are output on three separate four-bit lines DECODE_BOTTOM 316, DECODE_MIDDLE 318, and DECODE_TOP 320.

DECODE_BOTTOM 316 is input to four-bit delay register 322, and DECODE_MIDDLE 318 is input to four-bit delay register 324. Both registers accept values on their inputs at positive going transitions in OUT_BYTE CLOCK 326, which is produced by OR-gate 325. 23_CNT 270, 13_CNT 272, and 3_CNT 274 are input to OR-gate 325 to produce a signal with a pulse at every 10 counts of module-30 counter 260 of FIG. 7. Thus, OUT_BYTE CLOCK 326 has three equally spaced pulses for each pair of interleaved codewords. The output of delay registers 322 and 324 is DELAYED_BOTTOM 328 and DELAYED_MIDDLE 330, respectively.

The signals from Trellis Decoder 314 and delay registers 322 and 324 are input to two 4-bit by 3-input multiplexers, 332 and 334, which have three common enables. Multiplexers 332 and 334 both have three inputs A, B, and C, and three enable inputs Enable_A, Enable_B and Enable_C where a high value on Enable_A, Enable_B and Enable_C causes the multiplexers to pass the value on input A, B, or C, respectively.

Enable_A receives 3_CNT 274 from count decoder 264 of FIG. 7. 3_CNT 274 is high during the period when module-30 counter 260 is on count "3". Similarly, Enable_B receives 13_CNT 272 and Enable_C receives 23_CNT 274. Thus, each input, A, B and C, of multiplexers 332 and 334 are passed to the outputs at different times separated by ten counts of module-30 counter 260. The four-bit outputs of the two multiplexers are combined to form 8-bit BYTELINE 336. The value on BYTELINE 336 is loaded into output register 338 upon each positive-going transition in OUT_BYTE CLOCK 326. The value is held at the output of output register 338 until the next positive going transition in OUT_BYTE CLOCK 326. Thus, the multiplexers 332 and 334 work with output register 338 to perform a parallel to serial conversion.

For example, when 3_CNT 274 becomes high, the values at the A inputs of multiplexers 322 and 324 are output on two separate four-bit lines from the multiplexers. The A input of multiplexer 334 receives DECODE_TOP 320 and the A-input of multiplexer 332 receives DECODE_MIDDLE 318. Thus, at the count of "3", BYTELINE 336 has the first eight-bits of the first decoded codeword of a pair of interleaved codewords.

The pulse on 3_CNT 274 also causes a pulse on OUT_BYTE CLOCK 326 causing delay register 322 to load DECODE_BOTTOM 316 and output register 338 to load BYTELINE 336.

The next enablement of multiplexer 332 and 334 occurs at count "13" when 13_CNT 272 goes high for a short period. At this time, Trellis Decoder 314 has decoded the second codeword in the pair of interleaved codewords and DECODE_BOTTOM 316, DECODE_MIDDLE 318, and DECODE_TOP 320 each contain four bits of user data and/or ECC values from the second decoded codeword. 13_CNT 272 enables the B-inputs of multiplexers 334 and 332 which are tied to DELAYED_BOTTOM 328 and DECODE_TOP 320 respectively. Thus, the B-input of multiplexer 334 receives the last four bytes of the first decoded codeword, and the B input of multiplexer 332 receives the first four bits of the second decoded codeword. This byte replaces the current byte in output register 338.

The pulse on 13_CNT 272 also causes the second and third four-bit nibbles of the second decoded codeword to be loaded into delay registers 324 and 322 respectively. These stored values are used on the third enablement of multiplexers 332 and 334 upon the occurrence of a pulse on 23_CNT 270. The pulse is fed into Enable_C, and causes the multiplexers to pass the values at their C-inputs to BYTELINE 336. The value at the C-input of multiplexer 334 is DELAYED_MIDDLE 330 which contains the middle nibble of the second decoded codeword. The value at the C-input of multiplexer 332 is DELAYED_BOTTOM 328 which contains the last nibble of the second decoded codeword. These values are loaded into output register 338 along BYTELINE 336.

For each pair of interleaved codewords, output register 338 produces three serial bytes comprised of the first eight-bits of the first decoded codeword; the last four bits of the first decoded codeword and the first four bits of the second decoded codeword; and the last eight-bits of the second decoded codeword. These three bytes represent the three bytes used to construct the two interleaved codewords in matched spectral null encoder 64 of FIG. 2.

Figure 9:
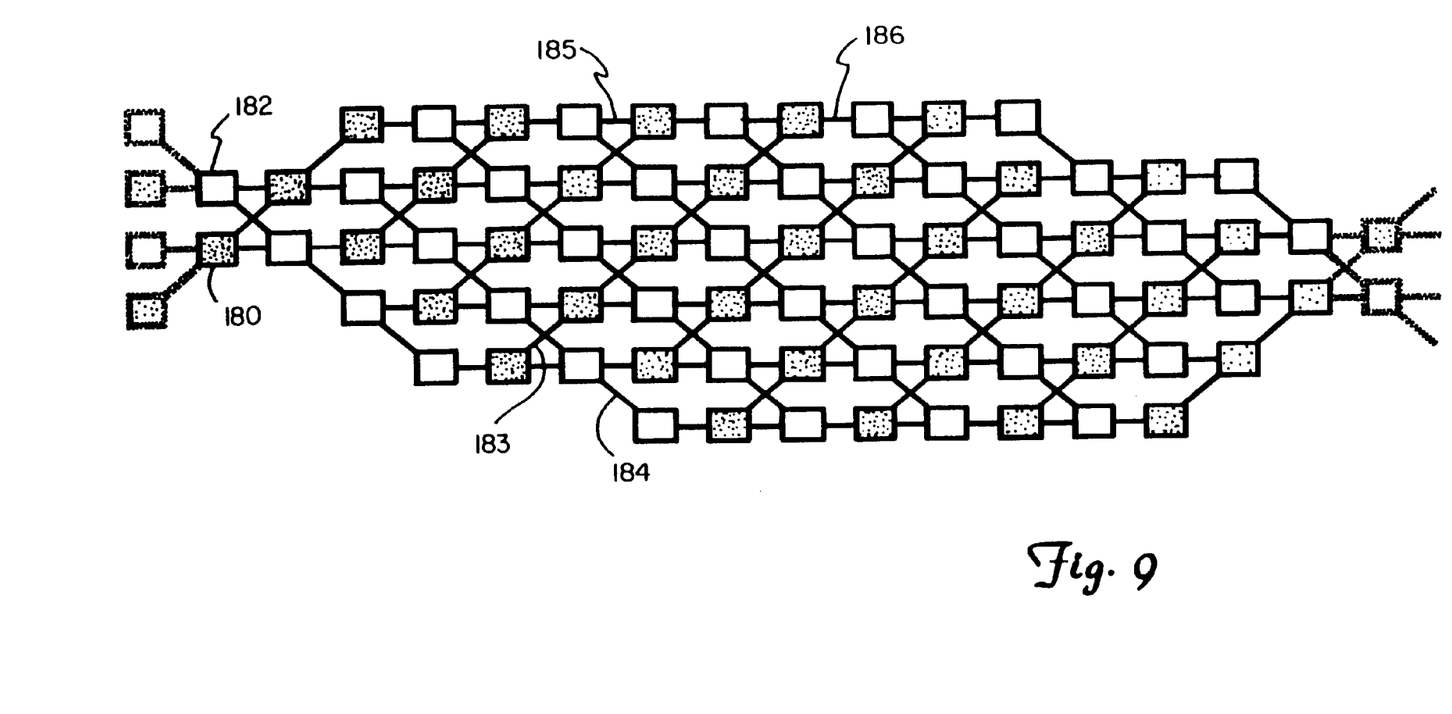
FIG. 9 is a Viterbi Detector trellis used to detect codewords in read equalized signal 40 of FIG. 1.

FIG. 9 is a diagram of a Viterbi Detector Trellis for use in Viterbi Detectors 236 and 238 of FIG. 7. The Viterbi Detector Trellis of FIG. 9 has two states for each of the states shown in the trellis diagram of FIG. 6. One state is indicated by a shaded box and the other state is represented by a non-shaded box. The shaded boxes indicate that the previous channel bit represented a +1 direction of magnetization and the non-shaded boxes indicate that the previous channel bit represented a −1 direction of magnetization. For instance, shaded box 180 and non-shaded box 182 are the split states for state 172 of FIG. 6. If the channel bit leading to state 172 represented a +1, the Viterbi Detector Trellis would be in state 180. However, if the bit previous to state 172 represented a −1, the Viterbi Detector Trellis of FIG. 9 would be in state 182.

As discussed earlier, channel 32 is preferably a PR4 channel that ideally has a transfer characteristic of $(1-D^2)$, where "1" represents WRITE signal 30 and $D^2$ represent the write signal delayed by two time units. This means that READ signal 34 will ideally be a $1-D^2$ representation of WRITE signal 30 of FIG. 1. Those skilled in the art will recognize that a $(1-D^2)$ transfer function is the same as two interleaved $(1-D)$ transfer functions. Thus, if READ signal 34 is deinterleaved, as shown in FIG. 7, it produces two $(1-D)$ signals. This means that the signal received at each Viterbi Detector is equivalent to a series of channel input bits minus that series delayed by one time unit.

The signals at the Viterbi Detectors are not perfect 1-D representations of WRITE signal 30. First, passing READ signal 34 through read equalizer 38 equalizes the signal so that it has expected sample values of +1, −1 and 0. In addition, NOISE 36 of FIG. 1 corrupts READ signal 34. Values in the deinterleaved signals that are close to +1 are generally decoded as a transition from "−1" to "+1" in WRITE signal 30; values close to "0" are generally decoded as no transition in WRITE signal 30; and values close to "−1" are generally decoded as a transition from "+1" to "−1" in WRITE signal 30.

Thus, a value near "0" generally indicates that the channel bit remains the same. Detected "0's" are depicted on the detector trellis as any path between two consecutive shaded boxes, such as path 183, or any path between two consecutive non-shaded boxes, such as path 184. A detected "+1" is shown on the detector trellis as a path from a non-shaded box to a shaded box, such as path 185, and a detected "−1" is shown as a path from a shaded box to a non-shaded box, such as path 186.

To detect a codeword, each Viterbi Detector constructs several hypothetical paths through the detector trellis for its deinterleaved signal and then determines which hypothetical path is closest to the deinterleaved signal. To build these hypothetical paths, the Viterbi Detectors look at each time period sequentially. For each time period, the detectors determine the most likely path into each state given the value in the deinterleaved signal for that time period. The most likely path into each state is determined by comparing the accumulated metrics of each path into that state. The accumulated metric for each path is the sum of a previous state metric and a branch metric. For the preferred embodiment of this invention, the single bit paths (branches) have been assigned the branch metrics listed below:

| SINGLE BIT PATH | BRANCH METRIC |
| --- | --- |
| shaded-to-shaded | $b_0 = 0$ |
| white-to-white | $b_0 = 0$ |
| shaded-to-white | $b_{-1} = .5 + y$ |
| white-to-shaded | $b_1 = .5 - y$ | where y is the equalized sample value in the deinterleaved signal for that time period. For each path leading into a state, the detector computes a metric equal to the sum of the branch metric for the last bit of the path, plus the state metric of the predecessor state which is at the source of the last bit. These metrics are compared, and the minimum metric and its associated path are selected as the most likely. The metric and path history are updated via the commonly known ADD-COMPARE-SELECT method of the Viterbi algorithm.

When finished, the detector has chosen one path into each state for that time period. By repeating this procedure for each time period, some paths through the detector trellis will terminate and some will wind their way through the entire trellis. The path with the smallest state metric is chosen as the most likely codeword.

Figure 10:
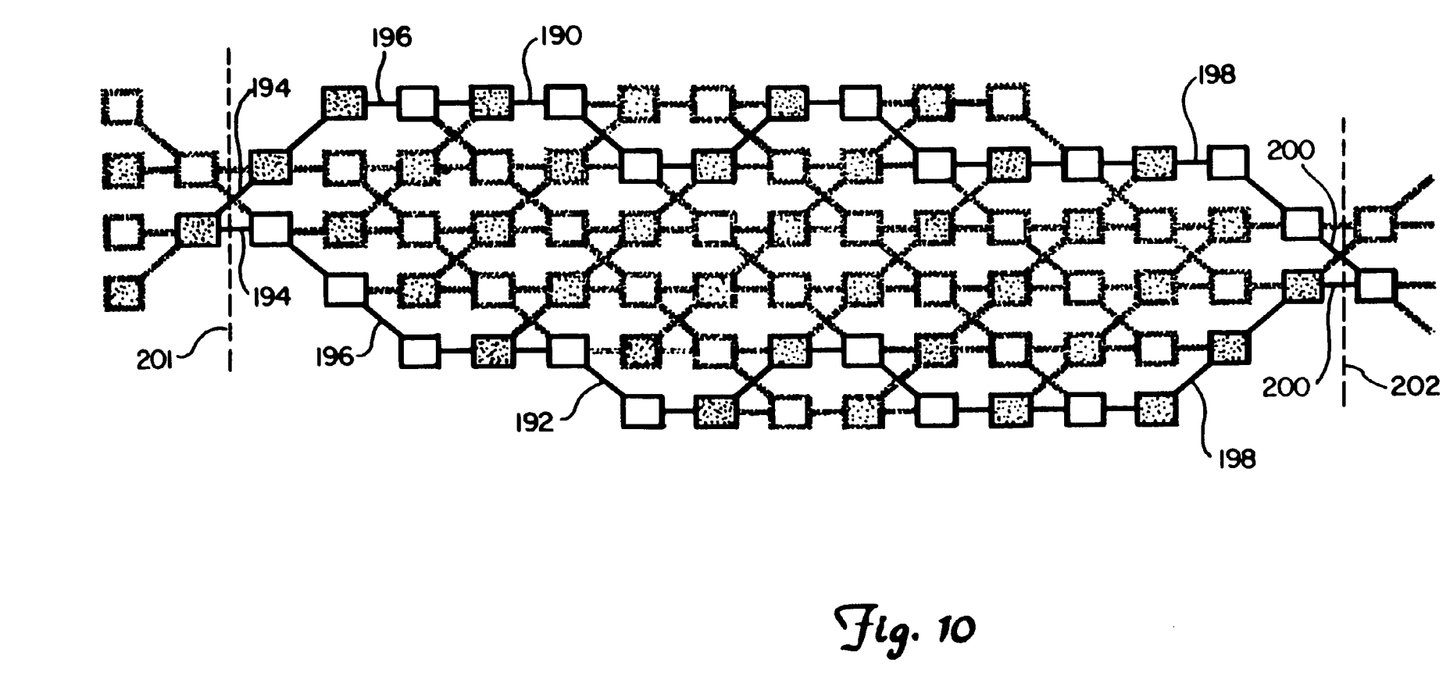
FIG. 10 is a minimum distance error event in the Viterbi Detector trellis of FIG. 9.

FIG. 10 shows the Viterbi Detector Trellis of FIG. 9 with a minimum distance error event of maximum length for the trellis code of the present invention. A minimum distance error event is the most likely error event that can occur and still produce valid codewords. The minimum distance of a code is the minimum sum-of-squared differences between noiseless samples corresponding to two different paths in the trellis. For the trellis code of the present invention, the minimum distance of the code is 4.

The depiction of a minimum distance error event appears as two pathways depicted as solid black lines through the detector trellis. In FIG. 10, first path 190 and second path 192 are both valid codewords. The data streams which produce first path 190 and second path 192 differ from each other in four different instances by a value of 1. The sum of the squares of these differences equals 4, which is the minimum distance error for this trellis code. These four differences are marked as error events 194, 196, 198 and 200. Note that the minimum distance error event does not cross codeword boundaries, 201 and 202. The two paths are forced back together at codeword boundary 202 before the beginning of the next codeword. This ensures that a burst error will not cross codeword boundaries, thus ensuring that the error will not affect the proper detection of other pairs of interleaved codewords.

Because minimum distance error events are contained within one codeword, burst errors will be limited to one codeword. When the codewords are later decoded and recombined into three bytes of ECC Data, the fact that burst errors have been contained to one codeword means that the burst errors will be contained to three bytes of ECC and user data. Thus, no one burst error will consume all of the ECC's ability to correct errors.

Although the present invention has been described with reference to preferred embodiments, workers skilled in the art will recognize that changes may be made in form and detail without departing from the spirit and scope of the invention.

What is claimed is:

1. A digital communication apparatus for transmitting sectors of digital units, each sector comprising a series of blocks and each block including error correction values used to detect and correct errors within the block, the error correction values useful in correcting up to a maximum number of digital units, the digital communication apparatus comprising:

an encoding system, for producing an encoded series of digital values from the blocks of digital units, the encoded series of digital values comprising sections of interleaved codewords, each codeword in each section separately encoded from other codewords in the section, the codewords of a section together encoded form a set of digital units, the set of digital units including one digital unit from each block in the sector;

a channel coupled to the encoding system to receive the encoded series of digital values and to produce a representation of the encoded series, the channel capable of occasionally introducing burst errors into the representation of the encoded series; and a decoding system, coupled to the channel to produce a representation of the blocks of digital units received by the encoding system, the decoding system's representation based on the channel's representation of the encoded series.

2. The digital communication apparatus of claim 1 wherein the encoding system comprises:

a partitioning means, for partitioning the digital units by dividing sets of digital units into two series of partitioned values, each set of digital units having one digital unit from each block in a sector;

two encoder means, each coupled to the partitioning means and each receiving one of the series of partitioned values, each encoder means translating each series of partitioned values into a series of codewords; and an interleaver, coupled to both encoder means and interleaving the series of codewords from the two encoder means into the encoded series of digital values.

3. The digital communication apparatus of claim 1 wherein the channel is a magnetic recording device.

4. The digital communication apparatus of claim 1 wherein the decoding system comprises:

a deinterleaver, for dividing the channel's representation into two data streams;

two parallel detectors each receiving one of the data streams from the deinterleaver and each producing a stream of codewords based on the respective data stream; and decoder means, coupled to the detectors, for generating the decoding system's representation of the encoded series from the series of codewords produced by the detectors.

5. The digital communication apparatus of claim 4 wherein the decoder means comprises:

gate means, receiving the two streams of codewords from the two detectors, the gate means for passing one of the two streams of codewords during a first time interval and the other of the two streams of codewords during a second time interval; and a decoder, coupled to the gate means, for receiving codewords and for translating each codeword to form the decoding system's representation of the blocks of digital values received by the encoding system.

6. An encoding apparatus for encoding user data and error correction values for transmission across a channel, the encoding apparatus comprising encoder means for encoding the user data and error correction values into codewords and combining means for combining each codeword with at least one other codeword, the encoding apparatus characterized by:

partitioning means coupled to the encoder means, for partitioning the user data and error correction values provided to the encoder means, the partitioning being such that two burst errors in the channel will not cause more errors than the error correction values can correct.

7. The apparatus of claim 6 wherein each of said of two burst errors is localized within a respective set of combined codewords.

8. The encoding apparatus of claim 6 wherein the encoding means comprises two parallel encoders.

9. The apparatus of claim 8 wherein each of said of two burst errors is localized within a respective set of combined codewords.

10. The encoding apparatus of claim 8 wherein the combining means combines codewords in pairs and the two codewords in each pair are together encoded from three bytes of user data and error correction values, the three bytes each from separate blocks of user data and error correction values, the error correction values capable of correcting up to two bytes of user data and error correction values per block.

11. The apparatus of claim 10 wherein each of said of two burst errors is localized within a respective set of combined codewords.

12. A method of transmitting digital words of user data and error correction code through a channel, the method comprising:

dividing the user data and error correction code into at least two streams of digital values;

encoding each stream of digital values into a stream of codewords, where each codeword is delimited by codeword boundaries such that minimum distance errors do not cross codeword boundaries;

combining at least two streams of codewords into a combined stream of codewords, the combined stream of codewords such that a single burst error in the channel will corrupt beyond recognition at most a number of codewords that together represent fewer digital words than the number of digital words the error correction code can correct; and transmitting the combined stream of codewords through the channel.

13. The method of claim 12 wherein said single burst error does not cross codeword boundaries.

14. The method of claim 12 wherein dividing the user data and error correction code comprises dividing at least one digital word of user data and error correction code into at least a first portion and a second portion, and placing the first portion in a first stream of digital values and the second portion in a second stream of digital values.

15. The method of claim 14 wherein said single burst error does not cross codeword boundaries.

* * * * *